United States Patent
Klootwijk et al.

(10) Patent No.: US 6,300,210 B1
(45) Date of Patent: Oct. 9, 2001

(54) METHOD OF MANUFACTURING A SEMICONDUCTOR DEVICE COMPRISING A BIPOLAR TRANSISTOR

(75) Inventors: Johan H. Klootwijk; Cornelis E. Timmering, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/440,594

(22) Filed: Nov. 15, 1999

(30) Foreign Application Priority Data

Nov. 13, 1998 (EP) .................................................. 98203832

(51) Int. Cl.⁷ .................................................. H01L 21/331
(52) U.S. Cl. .......................... 438/372; 438/365; 438/546; 438/564
(58) Field of Search .................................... 438/365, 372, 438/546, 564, FOR 165

(56) References Cited

U.S. PATENT DOCUMENTS

| | | |
|---|---|---|
| 3,943,621 * | 3/1976 | Hartman . |
| 4,006,045 * | 2/1977 | Aboaf et al. . |
| 4,614,666 * | 9/1986 | Lindenfelser . |
| 4,996,581 * | 2/1991 | Hamasaki . |
| 5,024,957 * | 6/1991 | Harame et al. . |
| 5,385,850 * | 1/1995 | Chu et al. . |
| 5,439,832 | 8/1995 | Nakamura ............................. 437/31 |
| 5,512,785 | 4/1996 | Haver et al. ......................... 257/758 |
| 5,663,097 * | 9/1997 | Sakamoto et al. . |
| 5,731,240 * | 3/1998 | Kataoka . |
| 6,077,752 * | 6/2000 | Norstrom . |
| 6,100,152 * | 8/2000 | Emons et al. . |
| 6,124,181 * | 9/2000 | Ueda . |
| 6,150,224 * | 11/2000 | Terpstra et al. . |
| 6,180,442 * | 1/2001 | Gris . |

FOREIGN PATENT DOCUMENTS

6356915-A * 3/1988 (JP) .

OTHER PUBLICATIONS

"Bipolar Technology for a 0.5–Micron–Wide Base Transistor with an ECL Gate Delay of 21.5 Picoseconds", by S. Nakamura et al., XP 000687466, IEDM 1992.

* cited by examiner

Primary Examiner—George Fourson
Assistant Examiner—Michelle Estrada
(74) Attorney, Agent, or Firm—Steven R. Biren

(57) ABSTRACT

The invention relates to the manufacture of a so-called double poly bipolar transistor. In a layer structure of a first insulating layer (4), a polycrystalline layer (5) of silicon and a second insulating layer (6), an opening (7) is formed which extends to a monocrystalline part of the semiconductor body (10), a third insulating layer (8) being provided on the bottom of the opening (7). Via the opening (7) at least a part (1A) of the base (1) is formed. By means of a further opening (9) in the third insulating layer (8), the emitter (3) is formed. A drawback of the known method resides in that the transistors obtained by means of said method exhibit a relatively great spread in electrical characteristics, such as a base current which is not ideal and demonstrates a spread. In a method in accordance with the invention, the doping atoms are provided prior to the provision of the third insulating layer (8), the third insulating layer (8) is formed by means of deposition, and the semiconductor body (10) is heated, after the provision of the third insulating layer (8), in an ambient comprising a gaseous compound (40) including oxygen. By directly providing the doping atoms, preferably from the gas phase, a very shallow and steep base (1) is obtained, resulting in an improved spread in electrical characteristics. This improvement is partly made possible by providing the third electrically insulating layer (8) at a later stage by means of CVD. The thermal treatment in an oxygen compound (40)-containing ambient averts the occurrence of a high base current as a result of the use of a CVD-deposited third insulating layer (8). Preferably use is made, for this purpose, of a short-cycle annealing step in a $N_2O$ or NO-containing ambient.

8 Claims, 2 Drawing Sheets

METHOD OF MANUFACTURING A SEMICONDUCTOR DEVICE COMPRISING A BIPOLAR TRANSISTOR

BACKGROUND OF THE INVENTION

The invention relates to a method of manufacturing a semiconductor device comprising a semiconductor body including a bipolar transistor having a base region, a collector region and an emitter region, a monocrystalline silicon substrate being provided with a first insulating layer, a polycrystalline layer of silicon and a second electrically insulating layer, an opening being formed in this layer structure, which opening extends to a monocrystalline part of the semiconductor body, the bottom of the opening being provided with a third insulating layer, at least a part of the base region being formed via said opening by providing doping atoms in the monocrystalline part of the semiconductor body, and the emitter region being formed by means of a further opening in the third electrically insulating layer, which opening is smaller than the first opening in the monocrystalline part of the semiconductor body. It is noted that, in this application, the term "insulating" is to be taken to mean "electrically insulating".

Such a method is known from United States patent specification U.S. Pat. No. 5,512,785, published on Apr. 30, 1996. In said document, a description is given of a method of manufacturing a so-called double poly bipolar transistor: reference is made, in particular, to the description of FIG. 6 and FIG. 7. Such a transistor is obtained by making an opening in a stack of layers comprising a first insulating layer, a polycrystalline layer of silicon and a second insulating layer, which opening extends to a monocrystalline part of the semiconductor body. A third insulating layer (see FIG. 7) is subsequently provided on the bottom of this opening by means of thermal oxidation of the semiconductor body. A part of the base region of the transistor is formed by subsequently launching doping atoms, through the third insulating layer, into the monocrystalline part of the semiconductor body. The polycrystalline layer is provided, in the above-mentioned opening, with so-called spacers of (doped) polycrystalline silicon by means of which the polycrystalline layer is connected to the monocrystalline part of the semiconductor body, said spacers forming, in the above-mentioned opening, another part of the base region as a result of out-diffusion. After providing further spacers in the opening, and after forming a window in the third insulating layer, a further polycrystalline layer of silicon is provided in the opening, thereby forming the emitter region in the monocrystalline part of the semiconductor body, which further polycrystalline layer of silicon serves as the connection region of said emitter region.

A drawback of the known method resides in that the transistors manufactured in accordance with said method have electrical characteristics, such as a base current which is (too) high, which exhibit a relatively great spread. In view of the yield, this is undesirable, so that the transistors manufactured by means of the known method are relatively expensive.

SUMMARY OF THE INVENTION

It is an object of the invention to provide a method by means of which transistors can be manufactured having a smaller spread in electrical characteristics and otherwise excellent properties. The method should also be as simple as possible.

To achieve this, a method in accordance with the invention is characterized in that the doping atoms are provided in the monocrystalline part of the semiconductor body before the third insulating layer is applied, the third insulating layer is formed by means of deposition, and the semiconductor body is heated, after the provision of the third insulating layer, in an atmosphere comprising a gaseous compound which includes oxygen. The invention is based on the following recognitions. By providing the doping atoms used to form a part of the base region, in the monocrystalline part of the semiconductor body before providing the third electrically insulating layer, for example, a very shallow ion implantation or selective or non-selective epitaxy, but in particular doping from the gas phase can be used to provide said layer. In all these cases, but particularly in the case of doping from the gas phase, the base region formed, at least the part thereof formed in this step, may be very steep and shallow. As a result, the spread in electrical characteristics of the transistor, such as in the above-mentioned base current, decreases, resulting in a higher yield of the process. The invention is further based on the recognition that this advantage is (partly) lost again if the third insulating layer is subsequently formed by thermal oxidation, as in the known method. A third insulating layer formed by means of deposition from the gas phase does not have this drawback since the provision of such a layer causes no, or at least very little, (out-)diffusion of the part of the base region already formed. However, it has been found that a third insulating layer thus formed leads to considerably worse transistors, i.e. transistors whose base current is much too high, particularly at a low voltage. It has been found that this can be attributed to a relatively high, non-ideal component in the base current, which is caused by recombination, which in turn is caused by surface conditions between the monocrystalline part of the semiconductor body and the third insulating layer. It is precisely the use of a small base thickness as intended by the invention which causes this problem to manifests itself. The above-mentioned surface conditions are neutralized by subjecting the semiconductor body, after the provision of the third insulating layer, to a thermal treatment in an ambient of a gaseous substance which includes oxygen. By virtue thereof, the transistors thus manufactured exhibit a small spread in electrical characteristics and, in addition, an ideal base current which is low also at low voltages, while, surprisingly, the very small thickness of the base region is preserved. An additional advantage is that during this thermal treatment, the packing density of the deposited third insulating layer is increased, so that in the case of a deposited silicon dioxide layer, the properties of a silicon dioxide layer obtained by thermal oxidation are approached.

Preferably, the third insulating layer is made from silicon dioxide and applied by means of CVD (=Chemical Vapor Deposition) using gaseous TEOS (=Tetra Ethyl Ortho Silicate). This applies also to the second insulating layer. A suitable growth temperature lies in the range between 600 and 800° C. A suitable thickness of the third insulating layer is 20 nm.

In a preferred embodiment of a method in accordance with the invention, a compound of oxygen and nitrogen is used as the gaseous compound. In this manner, the transition between the monocrystalline silicon and the third insulating layer is best passivated. Besides, the third insulating layer is slightly converted into an oxynitride. However, the best conditions are those which cause this (bulk) nitrification to be limited: the nitrogen content of the third insulating layer is preferably smaller than 5 at. %. Too high a nitrogen content may lead to the development of recombination centers in the third insulating layer, resulting in a deterioration of the insulating properties, which is undesirable. The best results are achieved if the thermal treatment takes place in a so-called short-cycle annealing step. For example by means of a laser, the semiconductor body is brought to a temperature in the range between 800 and 1100° C. for 5 to 30 seconds. A suitable example of a gaseous compound of oxygen is $O_2$. Favorable results have already been achieved with said compound. Surprisingly good results are achieved if an oxide of nitrogen is used as the gaseous compound of oxygen. $N_2O$ or NO proved to be particularly suitable.

In an important embodiment, the doping atoms are provided in the monocrystalline part of the semiconductor body by exposing the monocrystalline part of the semiconductor body to a gaseous substance comprising the doping atoms, while simultaneously heating said monocrystalline part. In this manner, a very shallow and steep doping profile is formed in the part of the base region formed in this step. To form a p-type base, use can be made of $B_2H_6$ as the gaseous substance, while for an n-type base, use can be made, for example, of $AsH_3$ or $PH_3$.

In an attractive further variant of a method in accordance with the invention, prior to the provision of the first polycrystalline layer of silicon, a window is formed in the first insulating layer, the width of said window exceeding the width of the opening in the layer structure. By virtue thereof, the first polycrystalline layer can be brought into direct contact, within the window, with the monocrystalline part of the semiconductor body. Subsequently, for example during forming a part of the base region from the gas phase, another part of the base region is formed from the polycrystalline layer by diffusion from the solid substance, namely at the location where the polycrystalline layer touches the monocrystalline part of the semiconductor body. Said polycrystalline layer further serves as a connection region for the base region. Preferably, the window in the first insulating layer is formed by forming the first insulating layer as a LOCOS (=Local Oxidation Of Silicon) oxide. However, it is very well possible to use more recent techniques employing CMP (=Chemical Mechanical Polishing).

The emitter region of the transistor is preferably formed by applying, after providing the third insulating layer and forming the further opening therein, a further polycrystalline layer of silicon in the opening and the further opening. The emitter region is then formed by out-diffusion.

The invention further comprises a semiconductor device with a bipolar transistor which is obtained by means of a method in accordance with the invention.

These and other aspects of the invention will be apparent from and elucidated with reference to the embodiment(s) described hereinafter.

Figure 1:
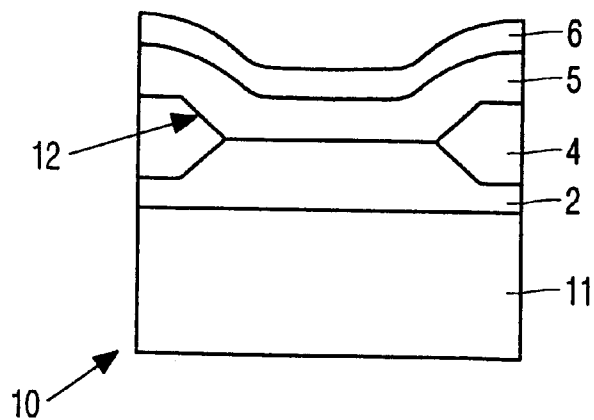
FIGS. 1 through 6 are diagrammatic, cross-sectional views, at right angles to the thickness direction, of a semiconductor device with a bipolar transistor at successive stages in the manufacture using a method in accordance with the invention.
Figure 2:
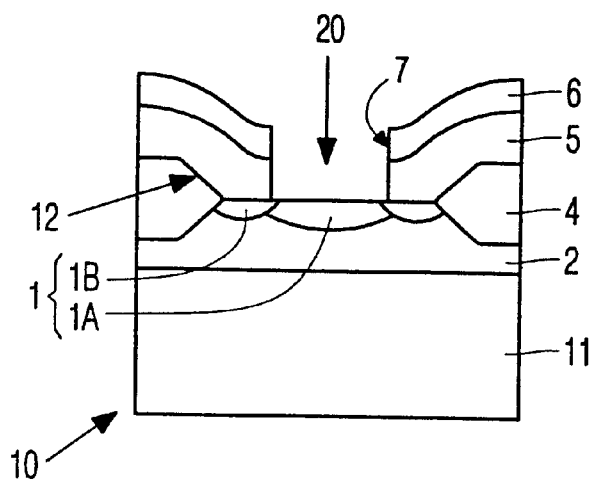
Figure 3:
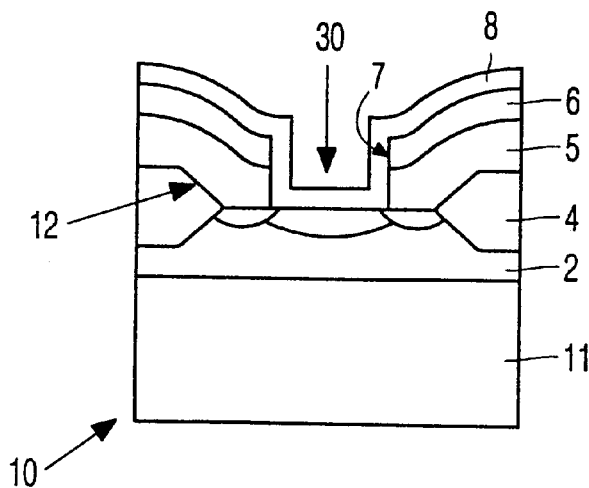
Figure 4:
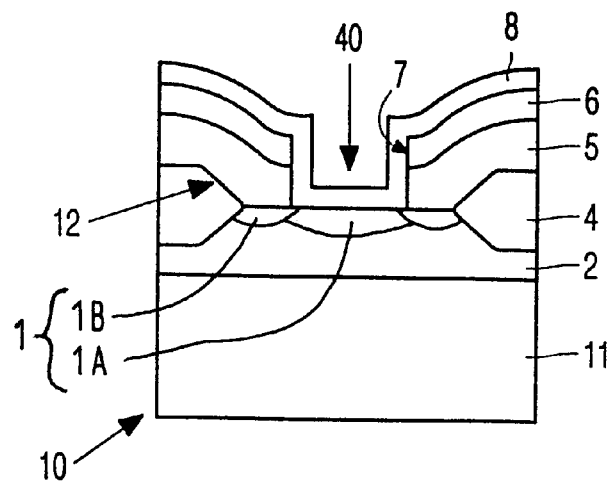
Figure 5:
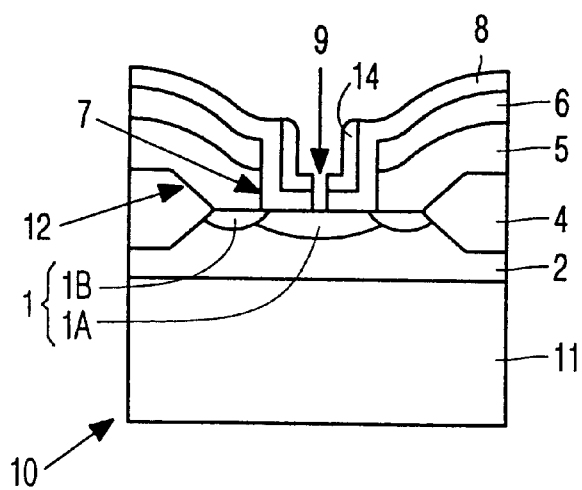

The Figures are diagrammatic and not drawn to scale, in particular the dimensions in the thickness direction being exaggerated for clarity. Semiconductor regions of the same conductivity type are generally hatched in the same direction. Corresponding regions are indicated by the same reference numeral as possible.

DESCRIPTION OF THE PREFERRED EMBODIMENTS

Figure 6:
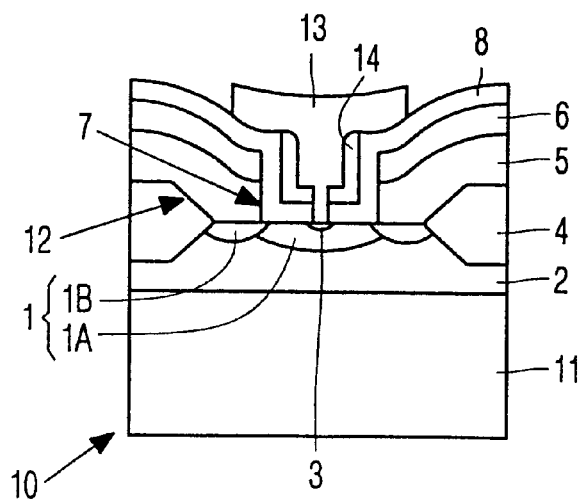

FIGS. 1 through 6 are diagrammatic, cross-sectional views, at right angles to the thickness direction, of a semiconductor device with a bipolar transistor at successive stages in the manufacture using a method in accordance with the invention. FIG. 6 is a diagrammatic, cross-sectional view, at right angles to the thickness direction, of the finished device comprising a bipolar transistor. The semiconductor body 10 comprises a monocrystalline substrate 11 of $p^+$-type silicon, which substrate has a diameter of 6 inches and is covered with a monocrystalline epitaxial layer 2 of n-type silicon having a doping concentration of $1 \times 10^{16}$ at/cm$^3$, which forms a collector 2 of the transistor. On and in the epitaxial layer 2 there is a first insulating layer 4 of silicon dioxide having a window 12 within which the collector 2 is situated. On the first insulating layer 4 there is a polycrystalline, here p-type, silicon layer 5 having a doping concentration of, in this example, $1 \times 10^{20}$ at/cm$^3$. The polycrystalline layer 5 is connected to a part 1B of the base region 1 of the transistor. Another part 1A of the base region 1 is situated below an opening 7 in the layer structure. The polycrystalline layer 5 is covered with a second, here 300 nm thick, insulating layer 6 of silicon dioxide. Above this layer there is a third insulating layer 8, here also of silicon dioxide, which layer is also situated in the opening 7 in the layer structure and has a further opening 9 in the bottom of the opening 7. The walls of the opening 7 are further provided with L-shaped spacers 14 of silicon nitride, and the opening 7, like the further opening 9, is filled with a further polycrystalline silicon layer 13 which is connected to the emitter 3 of the transistor and constitutes a connection region 13 thereof. The connection region of the collector region 2 is not shown in the Figure, and the electrical connections of the collector region 2, the base region 1 and the emitter region 3 are not shown either. Unless they are explicitly mentioned, the dimensions of the transistor of this example are customary dimensions.

The device described in this example is manufactured as described hereinbelow by means of a method in accordance with the invention. A p-type silicon substrate 11 of a customary thickness is first provided with an epitaxial n-type silicon layer 3 (see FIG. 1). On this silicon layer there is formed, not shown in the Figure, a mask of a 200 nm thick silicon nitride layer by means of plasma deposition, photolithography and etching. Underneath the nitride mask, there is a so-called cushion oxide layer. On either side of the mask, an approximately 0.3 μm thick first insulating layer 4 of silicon oxide, a so-called LOCOS oxide, is formed by means of thermal oxidation. Subsequently, the nitride mask and the underlying cushion oxide layer are removed by, respectively, etching in phosphoric acid and in hydrogen fluoride. In this manner, the first insulating layer 4 is provided with a window 12. Subsequently, by means of CVD, a polycrystalline layer 5 of silicon and a second insulating layer 6 of silicon dioxide are successively provided, which layers each have a thickness of 300 nm. The temperatures of these depositions are 600 and 700° C., respectively.

Subsequently, an opening 7 is formed in the resultant structure (see FIG. 2) by means of photolithography and plasma etching. The width of the opening 7 is chosen to be smaller than the width of the window 12. In this manner it is achieved that, after the formation of the opening 7, parts of the polycrystalline layer 5 remain in contact with the monocrystalline part 2 of the semiconductor body 10. All this also implies that aligning the window 7 with respect to the window 12 is not critical. The removal of the polycrystalline layer 5 at the location of the opening 7 is not trivial because polycrystalline silicon cannot be etched very selectively with respect to monocrystalline silicon, i.e. the collector region 2. This is the reason why in plasma-etching the polycrystalline silicon layer 5 use is made of an additional opening which is situated above the first oxide layer 4 in the mask (not shown) used in the formation of the opening 7. During plasma etching the polycrystalline layer 5, it is easy to detect the instant when the transition between the polycrystalline layer 5 and the underlying first insulating layer 4 is reached. Since the polycrystalline layer 5 has a substantially uniform thickness, the instant said transition is reached, also the polycrystalline layer 5 within the opening 7 has been removed or at least substantially removed. In order to ensure that the polycrystalline layer 5 within the opening 7 is entirely removed, the plasma-etching process is continued for a short period of time.

Subsequently, in accordance with the invention, a substance 20 containing the doping atoms is used to provide doping atoms directly in the exposed monocrystalline part 2 of the semiconductor body 10 so as to form a part 1A of the base region 1. As a result, the base region 1 has a very shallow and steep doping profile, which leads to a reduction of the spread in electrical characteristics of the transistors to be manufactured. Only then (see FIG. 2), the monocrystalline part 2 of the semiconductor body 10 is covered, also in accordance with the invention, with a third insulating layer 8 by means of deposition of or from a gaseous substance 30. Since such a deposition process, here CVD of/from gaseous TEOS 30, may take place at a low temperature, said shallow, steep doping profile of (part 1A of) the base region 1 is preserved. Subsequently, (see FIG. 4), also in accordance with the invention, the semiconductor body 10 is subjected to a thermal treatment in an ambient containing a gaseous compound 40 including oxygen. As a result, an important drawback of the CVD-provided third insulating layer 8, namely that the transistors manufactured have a much too high base current particularly at low voltages, is obviated. It has been found that such a high base current is caused by a high, non-ideal component which in turn is caused by surface conditions at the interface between the monocrystalline part of the semiconductor body 10 and the third insulating layer 8, which problem occurs precisely in the case of a small base thickness as intended by the invention. By subjecting the semiconductor body after the provision of the third insulating layer 8, to a thermal treatment in an ambient comprising a compound (40) of oxygen, said surface conditions are neutralized. As a result, transistors manufactured by a method in accordance with the invention do not only exhibit a small spread in electrical characteristics but also an ideal base current which is low also at low voltages. Thus, it has surprisingly been found that this thermal treatment does not necessarily lead to a larger thickness of the base.

Preferably, the last-mentioned thermal treatment is carried out, as in this example, with a gaseous compound (40) which apart from oxygen also includes nitrogen, here $N_2O$. By virtue thereof, the above-described passivation of the interface between monocrystalline silicon and the third insulating layer 8 is optimal. Such a treatment also causes the bulk properties of the third insulating layer 8 to be improved without causing an undesirable oxynitride formation in the bulk of said layer. The best results are obtained if the thermal treatment in this step is a so-called short-cycle annealing step. Good results are obtained by heating to a temperature in the range between 800 and 1100° C. for 5 to 30 seconds. The ambient is formed, for example, by an inert gas or nitrogen to which $N_2O$ or NO is added. Preferably, use is made, as in this example, of a gas which is entirely composed of $N_2O$.

In this example, the doping atoms used to form the part 1A of the base region 1, are provided in the semiconductor body 10 by means of doping from the gas phase. This technique yields the best results. In this example, wherein an npn transistor is made, the gaseous substance 20 used is $B_2H_6$.

The manufacture of the transistor is subsequently continued (see FIG. 5) by providing spacers 14 in the opening 7 by means of deposition of a 0.1 μm thick silicon nitride layer 14 which is subsequently largely removed by etching. In the bottom of the opening 7, a further opening 9 is formed in the third insulating layer 8. Subsequently, the opening 7 and the further opening 9 are filled with a further polycrystalline layer 13 of n-type silicon. From the further polycrystalline layer 13, the emitter region 3 of the transistor is formed, by out-diffusion, in the monocrystalline part of the semiconductor body 10, while this layer 13 also serves as the connection region 13 of the emitter region 3. From the p-type polycrystalline layer 5, another part 1B of the base region 1 is formed, also by out-diffusion, in the monocrystalline part of the semiconductor body 10. This takes place substantially at the same time as the formation of the part 1A of the base region 1. The polycrystalline layer 5 also serves as a connection region 5 of the base region 1. Furthermore, the collector region 2 is customarily provided with a connection region, which is not shown in the drawing. The connection regions of the base, collector and emitter region are provided, also in a customary manner, with electrical connections, which are not shown in the drawing. This is the last step in the manufacture of the transistor by means of a method in accordance with the invention.

The invention is not limited to the above-examples since, within the scope of the invention, many modifications and variations are possible to those skilled in the art. For example, different compositions and thicknesses for the different (semiconductor) regions or layers may be chosen. It is also possible to use deposition techniques other than those mentioned, such as MBE (=Molecular Beam Epitaxy) and CVD (=Chemical Vapor Deposition). Also the manufacture can be modified in various ways.

It is also possible to choose a different geometry and different dimensions for the various regions of the transistor.

A device in accordance with the invention can also be a more complex device than a single bipolar transistor. The device may include a number of different active or passive electronic components. The transistor may also very well form part of a BI(C)MOS (=BIpolar (Complementary) Metal Oxide Semiconductor) IC.

What is claimed is:
1. A method of manufacturing a semiconductor device comprising a semiconductor body (10) including a bipolar transistor having a base region (1), a collector region (2) and an emitter region (3), a monocrystalline silicon substrate (11) being provided with a first insulating layer (4), a polycrystalline layer (5) of silicon and a second insulating layer (6), an opening (7) being formed in this layer structure, which opening extends to a monocrystalline part of the semiconductor body (10), the bottom of the opening (7) being provided with a third insulating layer (8), at least a part (1A) of the base region (1) being formed via said opening (7) by providing doping atoms in the monocrystalline part of the semiconductor body (10), and the emitter region (3) being formed by means of a further opening (9) in the third insulating layer (8), which opening is smaller than the first opening (7) in the monocrystalline part of the semiconductor body (10), characterized in that the doping atoms are provided in the monocrystalline part of the semiconductor body (10) before the third insulating layer (8) is applied, the third insulating layer (8) is formed by means of deposition, and the semiconductor body (10) is heated, after the provision of the third insulating layer and before forming the further opening in the third insulating layer (8), in an atmosphere comprising a gaseous compound (40) which comprises oxygen.

2. A method as claimed in claim 1, characterized in that the third insulating layer (8) is made of silicon dioxide and is preferably provided by means of CVD using gaseous TEOS (30).

3. A method as claimed in claim 1, characterized in that a compound (40) of oxygen and nitrogen is used as the gaseous compound (40).

4. A method as claimed in claim 3, characterized in that $N_2O$ or NO is used as the gaseous compound (40) of oxygen and nitrogen.

5. A method as claimed in claim 1, characterized in that a short-cycle annealing step is used in the step of heating the semiconductor device (10) in the gaseous compound (40) comprising oxygen.

6. A method as claimed in claim 1, characterized in that the doping atoms are provided in the monocrystalline part of the semiconductor body (10) by exposing the monocrystalline part of the semiconductor body to a gaseous substance (20) comprising the doping atoms while simultaneously heating said monocrystalline part.

7. A method as claimed in claim 1, characterized in that prior to the provision of the polycrystalline layer (5) of silicon, a window (12) is formed in the first insulating layer (4), the width of said window exceeding the width of the opening (7) in the layer structure.

8. A method as claimed in claim 1, characterized in that after providing the third insulating layer (8) and forming the further opening (9) therein, the opening (7) and the further opening (9) are provided with a further polycrystalline layer (13) of silicon with which the emitter region (3) is formed and in which a connection region of the emitter region (3) is formed.

* * * * *